United States Patent
Choi et al.

(10) Patent No.: US 11,054,736 B2
(45) Date of Patent: Jul. 6, 2021

(54) EXTREME ULTRAVIOLET (EUV) MASK FOR LITHOGRAPHY AND ASSOCIATED METHODS

(71) Applicant: Samsung Electronics Co., Ltd., Suwon-si (KR)

(72) Inventors: Woon-hyuk Choi, Yongin-si (KR); No-young Chung, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 271 days.

(21) Appl. No.: 16/001,213

(22) Filed: Jun. 6, 2018

(65) Prior Publication Data

US 2019/0163048 A1 May 30, 2019

(30) Foreign Application Priority Data

Nov. 28, 2017 (KR) .................. 10-2017-0160998

(51) Int. Cl.
*G03F 1/36* (2012.01)
*G03F 7/20* (2006.01)
*G03F 1/70* (2012.01)
*G03F 1/22* (2012.01)
*G03F 1/24* (2012.01)

(52) U.S. Cl.
CPC .................. *G03F 1/36* (2013.01); *G03F 1/22* (2013.01); *G03F 1/24* (2013.01); *G03F 1/70* (2013.01); *G03F 7/70441* (2013.01)

(58) Field of Classification Search
CPC .................. G03F 1/36; G03F 1/24; G03F 1/72
See application file for complete search history.

(56) References Cited

U.S. PATENT DOCUMENTS

| 8,423,920 | B2 | 4/2013 | Lee et al. |
| 8,705,838 | B2 | 4/2014 | Boehm et al. |
| 2012/0224156 | A1 | 9/2012 | Lee et al. |
| 2016/0162624 | A1 | 6/2016 | Sun et al. |
| 2017/0123327 | A1 | 5/2017 | Jang et al. |

FOREIGN PATENT DOCUMENTS

| JP | 2007-248596 A | 9/2007 |
| KR | 10-2008-0021358 A | 3/2008 |
| KR | 10-2008-0056429 A | 6/2008 |
| KR | 10-1010754 B1 | 1/2011 |

*Primary Examiner* — Daborah Chacko-Davis
(74) *Attorney, Agent, or Firm* — Lee IP Law, PC

(57) ABSTRACT

A method of manufacturing an extreme ultraviolet (EUV) mask, for use in an EUV exposure process, on a mask substrate includes constructing a first monitoring macro considering an effect caused by a slit used in the EUV exposure process, performing an optical proximity correction (OPC) using a plurality of second monitoring macros, wherein each of the plurality of second monitoring macros is substantially identical to the first monitoring macro, inputting mask tape-out (MTO) design data acquired through the OPC, preparing mask data including at least one of data format conversion, mask process correction (MPC), and job-deck for the MTO design data, and performing EUV exposure (writing) on the mask substrate based on the mask data.

11 Claims, 15 Drawing Sheets

EXTREME ULTRAVIOLET (EUV) MASK FOR LITHOGRAPHY AND ASSOCIATED METHODS

CROSS-REFERENCE TO RELATED APPLICATION

Korean Patent Application No. 10-2017-0160998, filed on Nov. 28, 2017, in the Korean Intellectual Property Office is incorporated by reference herein in its entirety.

BACKGROUND

1. Field

Embodiments relate to extreme ultraviolet (EUV) mask for lithography and associated methods.

2. Description of the Related Art

A lithography process during a semiconductor device manufacturing process is a technique of forming a circuit pattern by irradiating light onto a photosensitive film coated on a substrate. A deep ultraviolet (DUV) light source may be used as a light source. Also, processes using light sources such as EUV rays, electron beams, X-rays, and ion beams are being investigated, and EUV ray and electron beam exposure processes are being developed.

SUMMARY

Embodiments are directed to a method of manufacturing an extreme ultraviolet (EUV) mask, for use in an EUV exposure process, on a mask substrate, the method including constructing a first monitoring macro considering an effect caused by a slit used in the EUV exposure process, performing an optical proximity correction (OPC) using a plurality of second monitoring macros, wherein each of the plurality of second monitoring macros is substantially identical to the first monitoring macro, inputting mask tape-out (MTO) design data acquired through the OPC, preparing mask data including at least one of data format conversion, mask process correction (MPC), and job-deck for the MTO design data, and performing EUV exposure (writing) on the mask substrate based on the mask data.

Embodiments are also directed to a method of providing a monitoring macro, the method including generating a first simulation model by performing a first simulation on a sample macro including a plurality of pattern arrays arranged and spaced apart from each other and each including a plurality of patterns, generating a second simulation model by performing a second simulation different from the first simulation on the sample macro, comparing the first and second simulation models with each other, and constructing a monitoring macro by selecting at least some of the plurality of patterns of the sample macro.

Embodiments are also directed to an optical proximity correction (OPC) method, the method including constructing a first monitoring macro considering aberration caused by a slit used in an extreme ultraviolet (EUV) exposure process, generating an OPC model of an EUV mask design layout including a plurality of second monitoring macros, wherein each of the plurality of second monitoring macros is substantially identical to the first monitoring macro, and correcting the OPC model.

BRIEF DESCRIPTION OF THE DRAWINGS

Features will become apparent to those of skill in the art by describing in detail example embodiments with reference to the attached drawings in which.

DETAILED DESCRIPTION

Figure 1:
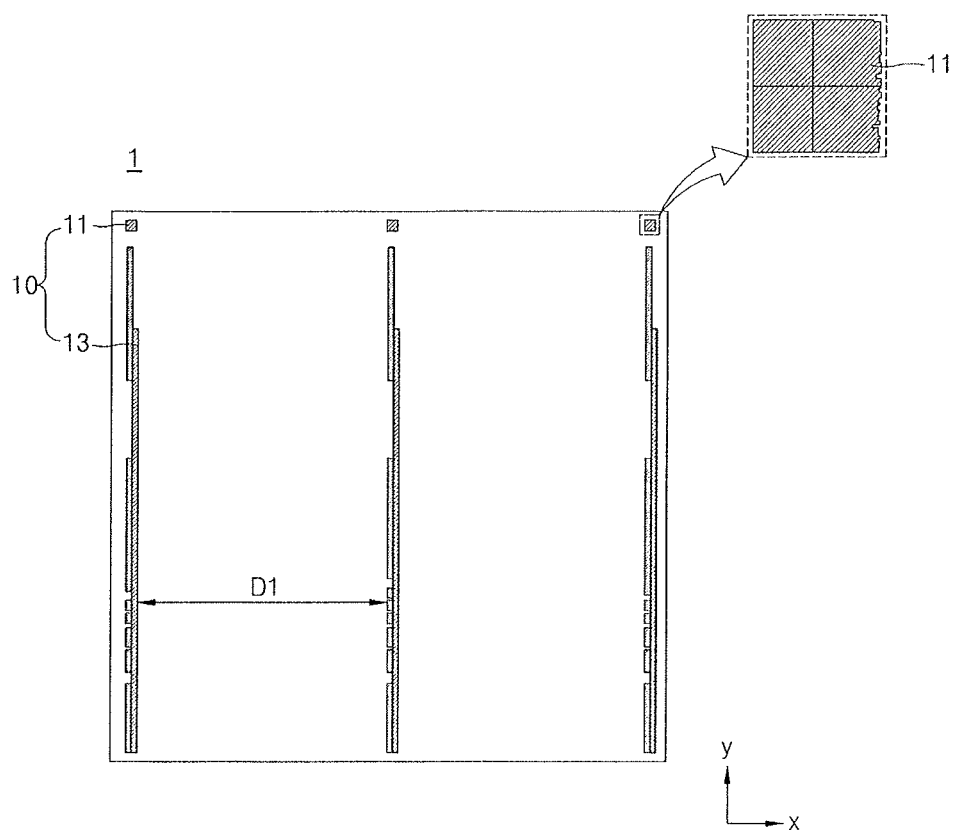
FIG. 1 illustrates a layout diagram for an example embodiment in which monitoring macros are arranged at intervals.

Hereinafter, example embodiments will be described in detail with reference to the accompanying drawings. Herein, like reference numerals will denote like elements, and redundant descriptions thereof will be omitted for conciseness.

Figure 2:
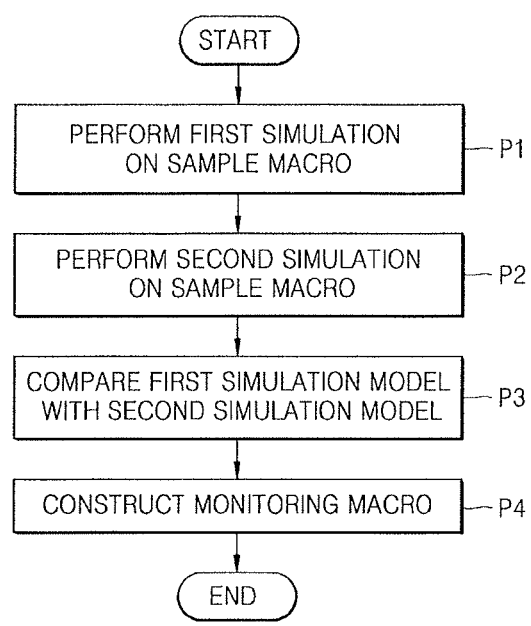
FIG. 2 illustrates a flowchart of a method of providing a monitoring macro according to an example embodiment.

FIG. 1 is a layout diagram for an example embodiment and FIG. 2 is a flowchart illustrating a method of providing a monitoring macro according to an example embodiment.

In FIG. 1, the layout diagram shows a sample macro 1. According to an example embodiment, the sample macro 1 may include patterns for constructing a monitoring macro. The sample macro 1 may correspond to one full shot. In an example embodiment, monitoring macros may be arranged at intervals in the extension direction of a slit, used in an EUV exposure process, where aberration occurs. According to example embodiment, the monitoring macro 100 may include, for example, line-and-space-type monitoring patterns, contact-type monitoring patterns, etc.

The sample macro 1 may include pattern arrays 10 spaced at a first distance D1, which is the distance between adjacent pattern arrays 10 in a first direction X. Each of the plurality of pattern arrays 10 may include a standard cell 11 and a lithography macro 13.

The directions parallel to the plane of the layout of the sample macro 1 while intersecting each other will be referred to as a first direction X and a second direction Y. The first direction X and the second direction Y may be perpendicular to each other.

Referring to FIGS. 1 and 2, according to an example embodiment, a first simulation may be a simulation for obtaining the critical dimension of patterns transferred by an exposure process for transferring the sample macro 1. In operation P1 in FIG. 2, the first simulation may be performed on the sample macro 1 to generate a first simulation model.

For reference, herein, the critical dimension may represent the pattern critical dimension of a clear portion. The clear portion may be a portion of an EUV mask where light is reflected and may correspond to a portion of a reflecting layer 210 (see the mask cross-section in FIG. 5A) that is exposed through an absorbing layer 230 (see FIG. 5A).

The full shot may correspond to an entire mask pattern that may be transferred through one scanning. In general, an extreme ultraviolet (EUV) exposure process may be performed in the manner of reduction projection (e.g., about 4:1 reduction projection). The mask pattern may be reduced to a size of about ¼ and transferred to a semiconductor substrate, and thus the full shot may correspond to about ¼ the size of the entire mask pattern. Herein, ¼ may be a length reduction ratio and may correspond to an area reduction ratio of about 1/16.

Herein, a shooting method of an exposure apparatus may be classified into a scanning method of shooting continuously and a step method of shooting in a step-by-step manner. In general, an EUV exposure process may proceed in a scanning manner, and accordingly, an EUV exposure apparatus may be generally referred to as a scanner. Also, in the EUV exposure apparatus, scanning may be performed using a slit that restricts light to a partial region of the mask. The slit may be a unit for restricting light in an apparatus for performing an EUV exposure process such that light may be uniformly irradiated with an EUV mask. The light may be restricted and irradiated to a partial region of the EUV mask through the slit, and the light may be continuously irradiated by moving the EUV mask in a direction opposite to a desired scanning direction. As such, the region irradiated with light on a test substrate through scanning over the entire region of the mask may be a region corresponding to the full shot.

In some embodiments, the full shot may have a horizontal size of, for example, about 26 mm and a vertical size of, for example, about 33 mm. The full shot may proceed through scanning through the slit as described above. Thus, a portion corresponding to the size of the slit may correspond to a portion of the full shot.

According to an example embodiment, a monitoring macro may be constructed by selecting patterns satisfying a predetermined criterion among the patterns of the sample macro 1 as described below. The sample macro 1 may include a plurality of the pattern arrays 10. According to an example embodiment, the sample macro 1 may include several to several hundred pattern arrays 10, for example.

According to an example embodiment, the pattern arrays 10 may be substantially identical to each other. In other example embodiments, the pattern arrays 10 may be different from each other.

According to an example embodiment, the pattern arrays 10 may be spaced apart from each other by a predetermined distance in the first direction X. According to an example embodiment, the pattern arrays 10 may be spaced apart and arranged at equal intervals from each other. Thus, the distance between adjacent pattern arrays 10 in the first direction X may be uniform. According to an example embodiment, the first distance D1, which is the distance between adjacent pattern arrays 10 in the first direction X, may be about 500 µm, for example. For example, the first distance D1 may be less than or greater than about 500 µm and may be selected as a suitable value according to design.

The pattern arrays 10 may extend in the second direction Y. As discussed above, according to an example embodiment, each of the plurality of pattern arrays 10 may include at least one of the standard cell 11 and the lithography macro 13. According to an example embodiment, each of the plurality of pattern arrays 10 may include a standard cell 11 and a lithography macro 13. According to an example embodiment, the standard cell 11 may be arranged at one end of the pattern array 10 in the second direction Y. In other example embodiments, each of the pattern arrays 10 may include, for example, two or more standard cells 11 and/or two or more lithography macros 13.

According to an example embodiment, the standard cell 11 may include, for example, one or more transistors as pre-designed logic elements used to speed up the design of integrated circuits. According to an example embodiment, the standard cell 11 may be used to design an application-specific integrated circuit (ASIC) with digital logic functions. The standard cell 11 may be used in a standard cell methodology that is one of the semiconductor design methods. The standard cell methodology may be a methodology for designing and manufacturing according to user's requirements by combining prepared standard function blocks and the like, and may be designed automatically using a computer-aided design (CAD) system.

According to an example embodiment, the standard cell 11 may be a small cell of a logic gate level. According to other embodiments, the standard cell 11 may be a large cell such as a central processing unit (CPU) or various peripheral devices. The standard cell 11 may be, for example, a NAND circuit, a NOR circuit, an inverter circuit, a flip-flop circuit, or the like. According to an example embodiment, the standard cell 11 may be of a poly-cell type that is compatible with a gate array. According to an example embodiment, the standard cell may be of a building block type that may easily optimize the chip area and easily incorporate a large cell of a large scale integration (LSI) or very LSI (VLSI) grade. A standard cell integrated circuit constructed as a building block type may be referred to as a cell-based LSI. The lithography macro 13 may be a group of circuit patterns used in an EUV lithography process.

According to an example embodiment, the lengths of the standard cell 11 in the first and second directions X and Y may be substantially equal to each other. According to an example embodiment, each of the lengths of the standard cell 11 in the first and second directions X and Y may be about 20 µm. In other example embodiments, the lengths of the standard cell 11 in the first and second directions X and Y may be different from each other.

According to an example embodiment, the length of the lithography macro 13 in the second direction Y may be greater than the length thereof in the first direction X. According to an example embodiment, the length of the lithography macro 13 in the first direction X may be equal to the length of the standard cell 11 in the first direction X. According to an example embodiment, the length of the lithography macro 13 in the first direction X may be, for example, about 20 µm.

According to an example embodiment, the first simulation may be a simulation reflecting aberration. The aberration will be described in more detail with reference to FIG. 5B. The first simulation may be performed by a commercial optical proximity correction (OPC) tool or other simulation tools. A first simulation model for the sample macro 1 may be generated by the first simulation.

The OPC method may refer to a method of suppressing the occurrence of an optical proximity effect (OPE) by correcting a pattern layout on a designed mask. The OPE may refer to a phenomenon in which a design pattern and an actual transfer pattern transferred by an exposure process vary due to the influence between adjacent patterns according to the miniaturization of patterns. The OPC method may be classified into, for example, two types: a rule-based OPC and a simulation-based or model-based OPC.

In order to perform the rule-based OPC, a test mask pattern may be first manufactured and the test mask pattern may be transferred to a semiconductor substrate to manufacture a test substrate. Thereafter, a design rule for determining bias data to be applied to the design data of a mask pattern may be determined based on the design data of a test mask and the measurement data about the pattern formed on the semiconductor substrate. When the design rule is determined, the mask pattern may be corrected based on the determined design rule. The correction may be performed in a layout CAD (CAD) stage of the mask pattern. The rule-based OPC may be costly and time-consuming because it may measure a test pattern for every pattern allowable in design and repeat the operation whenever the process changes.

The model-based OPC may generate kernels representing a transfer process considering an optical proximity effect based on the measurement results and/or simulation results about a predetermined test pattern. Through a process model including the kernels, the difference between the shape of the mask pattern and the shape of the pattern transferred to the semiconductor substrate may be obtained by simulation, and the mask pattern may be corrected according to the simulation results. The model-based OPC may be advantageous in terms of time and cost because it may avoid measuring a large number of test patterns.

The OPC may include a modification of a pattern layout and a method of adding sub-lithographic features (referred to as serifs) on the corners of patterns or a method of adding sub-resolution assist features (SRAFs) such as scattering bars.

The serifs may be rectangular features located on each corner of a pattern and may sharpen the corners of patterns that are finally transferred onto the semiconductor substrate. According to an example embodiment, the serifs may be used, for example, in an intersection region to compensate for a distortion factor caused by the intersection of two different patterns.

The SRAF may be formed in a size smaller than the resolution of exposure equipment and may be a feature that is not itself clearly transferred to a resist layer. Thus, the SRAF may not be a pattern that is actually formed on the semiconductor substrate. The SRAF may be an auxiliary pattern that is introduced to solve an OPC deviation caused by the density difference of patterns.

Referring again to FIGS. 1 and 2, in operation P2, a second simulation may be performed on the sample macro 1 to generate a second simulation model. According to an example embodiment, the second simulation may be a simulation for obtaining a critical dimension of the result of an exposure process on the sample macro 1. According to an example embodiment, the second simulation may be different from the first simulation. According to an example embodiment, the second simulation may be a simulation not reflecting an effect caused by aberration. The second simulation may be performed by, for example, substantially the same tool as the first simulation.

Subsequently, referring to FIGS. 1 and 2, in operation P3, the first simulation model may be compared with the second simulation model. The comparing of the first simulation model with the second simulation model may include comparing the critical dimension of a pattern of the first simulation model with the critical dimension of a corresponding pattern of the second simulation model.

According to an example embodiment, the comparing of the first simulation model with the second simulation model may include obtaining the difference between the critical dimension of a portion of the first simulation model and the critical dimension of a corresponding pattern of the second simulation model. According to an example embodiment, the comparison of the difference between the critical dimension of a portion of a pattern of the first simulation model and the critical dimension of a corresponding pattern of the second simulation model may be performed by the comparison of a mean value, a median value, a root mean square value, a minimum value, a maximum value, or the like. According to an example embodiment, the critical dimension differences between the pattern arrays 10 of one or more first and second simulation models arranged at both ends in the first direction X may be mainly compared with each other.

In other example embodiments, the comparing of the first simulation model with the second simulation model may include obtaining the difference between the critical dimension of the entire pattern of the first simulation model and the critical dimension of each pattern of the second simulation model corresponding thereto.

Figure 3A:
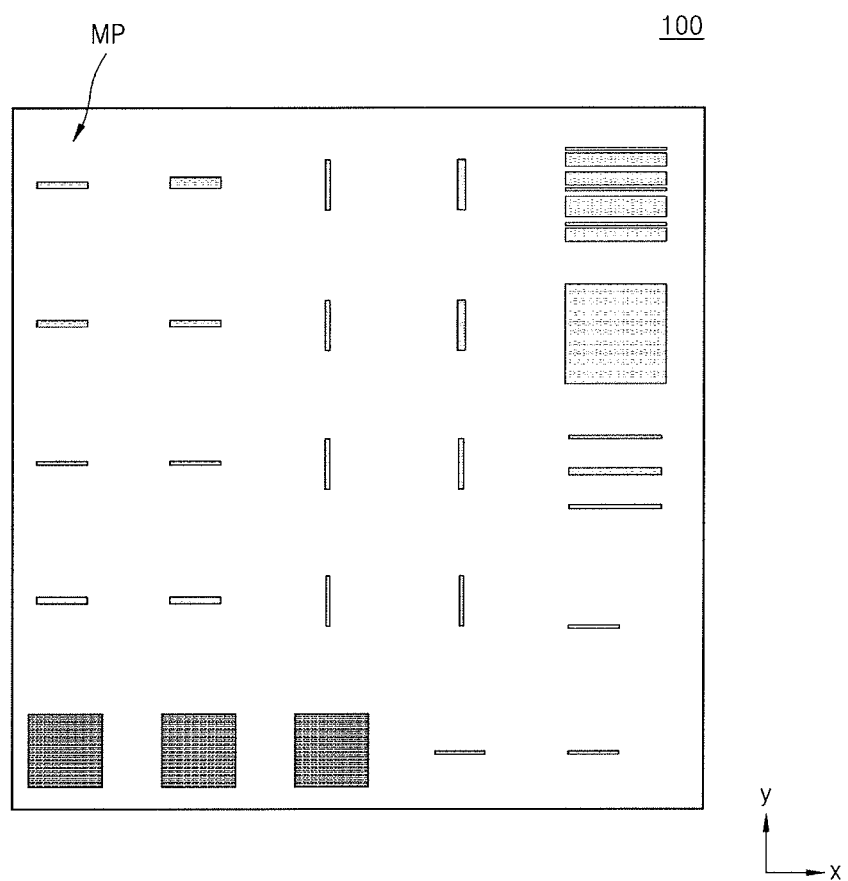
FIGS. 3A and 3B illustrate layout diagrams of methods of providing a monitoring macros according to an example embodiment.
Figure 3B:
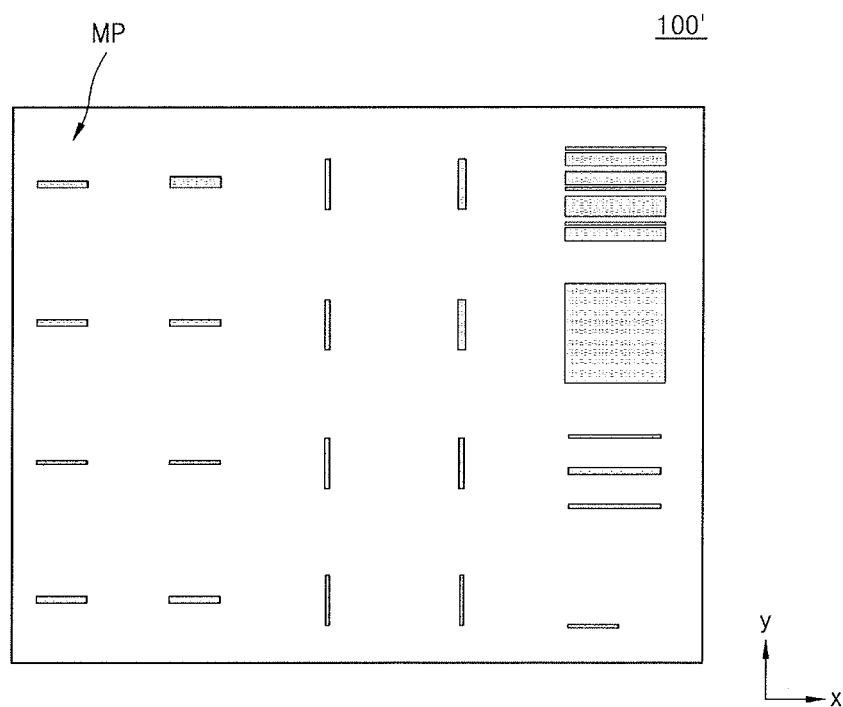

FIGS. 3A and 3B illustrate layout diagrams of method of providing monitoring macros according to an example embodiment.

First, referring to FIGS. 2 and 3A, a monitoring macro 100 may be constructed in operation P4. The constructing of the monitoring macro 100 may include constructing the monitoring macro 100 by selecting at least one monitoring pattern MP having the largest critical dimension difference between the first simulation model and the second simulation model.

For example, the constructing of the monitoring macro 100 including about 25 monitoring patterns MP may include selecting the 25th largest pattern from the patterns having the largest critical dimension difference between the first simulation model and the second simulation model. However, these 25 patterns are merely an example.

According to an example embodiment, the monitoring macro 100 may be manufactured considering an inter-layer margin in order to monitor a margin for an inter-layer open or short circuit caused by a process error due to an OPE.

The directions parallel to the plane of the layout of the monitoring macro 100 while intersecting each other are the first direction X and the second direction Y. According to an example embodiment, the lengths of the monitoring macro 100 in the first and second directions X and Y may be equal to each other. According to an example embodiment, the monitoring macro 100 may be square. According to an example embodiment, the monitoring macro 100 may include a plurality of monitoring patterns MP arranged in the first and second directions X and Y, respectively. According to an example embodiment, the monitoring macro 100 may include a plurality of monitoring patterns MP arranged in a matrix form. According to an example embodiment, the monitoring macro 100 may include five monitoring patterns MP that are spaced apart from each other and arranged in each of the first and second directions X and Y. According to an example embodiment, the monitoring macro 100 may include, for example, 25 monitoring patterns MP arranged in a matrix form.

According to some another example embodiment, as illustrated in FIG. 3B, a monitoring macro 100' may be rectangular. According to an example embodiment, the number of monitoring patterns MP arranged in the first direction X may be, for example, greater than the number of monitoring patterns MP arranged in the second direction Y. According to another example embodiment, the number of monitoring patterns MP arranged in the second direction Y may be greater than the number of monitoring patterns MP arranged in the first direction X.

According to an example embodiment, the monitoring patterns MP may include, for example, a single-bar type, a parallel-bar type, a cross type, a T type, an X type, a U type, a curved type, or a C type.

According to an example embodiment, the monitoring macro 100' may include monitoring patterns MP extending in a direction parallel to the first direction X. According to an example embodiment, the monitoring macro 100' may include monitoring patterns MP extending in a direction parallel to the second direction Y. According to an example embodiment, the monitoring macro 100' may include monitoring patterns MP extending in a direction intersecting the first and second directions X and Y. According to an example embodiment, the monitoring macro 100' may include monitoring patterns MP that are not parallel to the first and second directions X and Y.

According to an example embodiment, the monitoring patterns MP may include a plurality of patterns extending in parallel to each other. According to an example embodiment, any one of the monitoring patterns MP may include two or more line patterns parallel to each other, and the critical dimension thereof may also have various values.

According to an example embodiment, the monitoring macro 100 may include line-and-space-type monitoring patterns MP. According to an example embodiment, the monitoring macro 100 may include contact-type monitoring patterns MP. According to an example embodiment, the monitoring macro 100 may include only line- and space-type patterns or only contact-type patterns in order to match the characteristics of a layer to be formed using an EUV exposure process. According to an example embodiment, the monitoring macro 100 may be divided into predetermined regions, and then line-and-space-type monitoring patterns MP may be arranged in some regions and contact-type monitoring patterns MP may be arranged in other regions. According to an example embodiment, one monitoring macro 100 may include both line-and-space-type monitoring patterns MP and contact-type monitoring patterns MP.

Figure 4A:
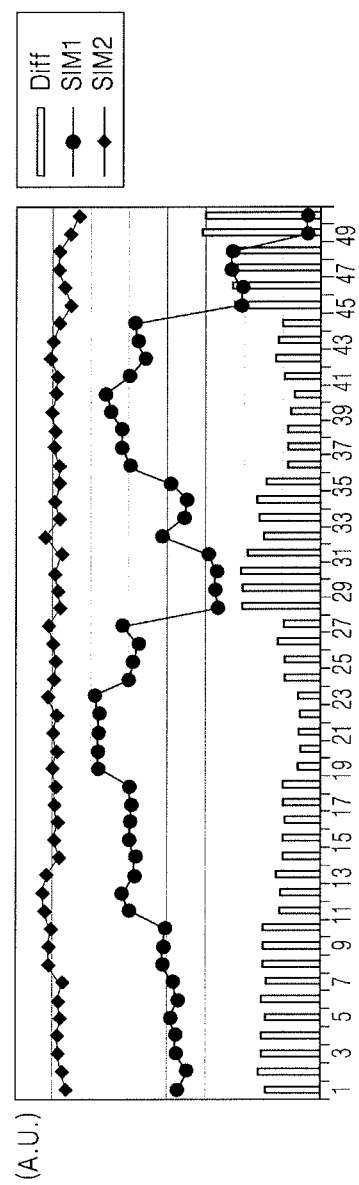
FIGS. 4A and 4B illustrate graphs of the effects of methods of providing a monitoring macros according to an example embodiment.
Figure 4B:
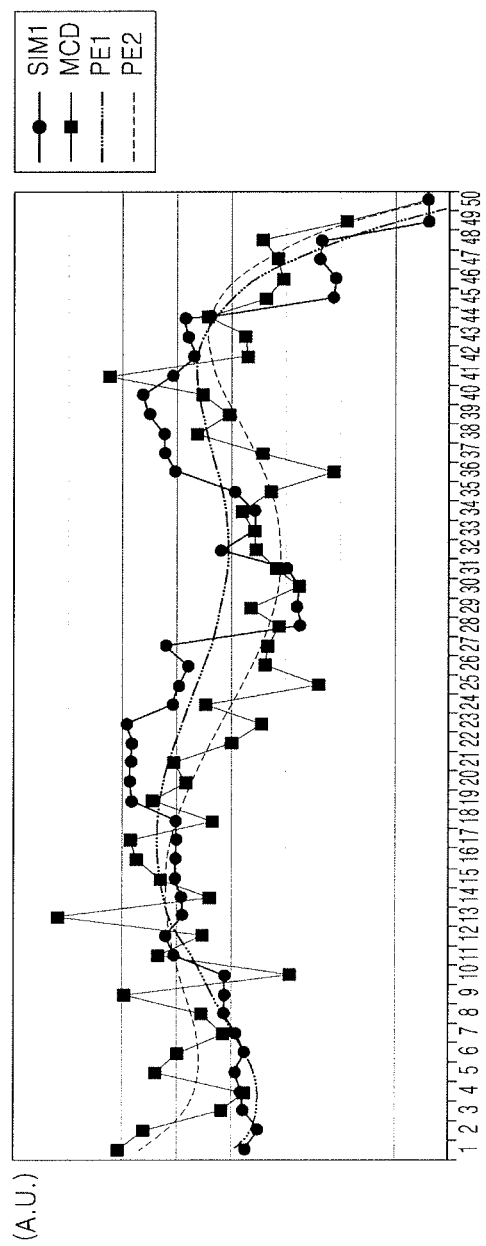

FIGS. 4A and 4B illustrate graphs of the effects of method of providing monitoring macros according to an example embodiment.

In particular, FIG. 4A illustrates each critical dimension for each pattern array 10 (see FIG. 1) with respect to the pattern having the largest critical dimension difference between the first simulation model and the second simulation model among the patterns included in the pattern arrays 10 (see FIG. 1). In FIG. 4A, the vertical axis represents the line width, and the horizontal axis represents the order from the left side of the pattern array 10 (see FIG. 1). SIM1 represents the critical dimension of the first simulation model, and SIM2 represents the critical dimension of the second simulation model. Diff represents the difference between SIM1 and SIM2 for each pattern array 10.

Also, with respect to the same patterns as in FIG. 4A, in FIG. 4B, MCD represents the measurement values of the critical dimensions of the actual patterns transferred to a wafer using a manufactured mask, and SIM1 is the same as SIM1 described above with reference to FIG. 4A. In FIG. 4B, PE1 and PE2 are polynomial approximation graphs for SIM1 and MCD, respectively.

Referring to FIGS. 4A and 4B, it may be seen that SIM1 may approximate the value of MCD relatively accurately. On the other hand, unlike SIM1, SIM2 may have a certain critical dimension over the entire region and may not approximate the value of MCD. Also, it may be seen that the critical dimensions for the pattern arrays 10 (see FIG. 1) arranged at both edges in SIM1 may have different values and the effects of a slit may occur differently with respect to the center thereof. The center may represent a pattern array of a portion corresponding to the center of the slit. For example, when 50 pattern arrays are given, the 25th to 26th pattern arrays may correspond to the center of the slit.

According to an example embodiment, by constructing the monitoring macro by selecting the patterns having the largest critical dimension change caused by the slit, the effect caused by the aberration generated during the exposure process may be monitored at a high speed and thus the ease and reliability of pattern monitoring may be improved.

Hereinafter, an explanation of differences between the critical dimensions of the first and second simulation models will be described with reference to FIGS. 5A and 5B.

Figure 5A:
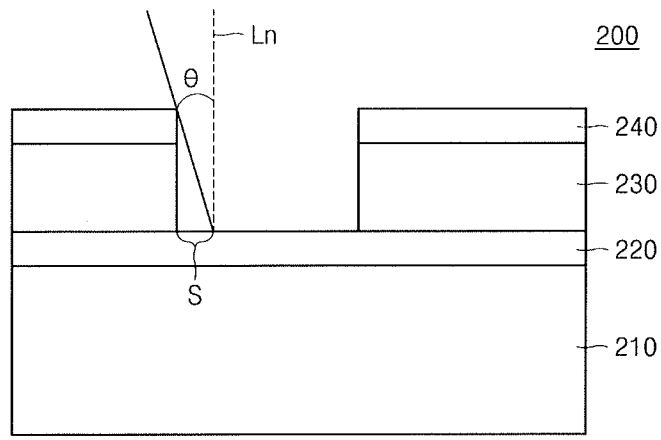
FIG. 5A illustrates a cross-sectional view of shadowing in an exposure process using an extreme ultraviolet (EUV) mask.

FIG. 5A is a cross-sectional view of an EUV mask for describing the effect of a slit in an EUV exposure process.

Referring to FIG. 5A, an EUV mask 200 may include a reflecting layer 210, a capping layer 220, an absorbing layer 230, and an anti-reflective coating (ARC) layer 240 that are sequentially stacked. For convenience of description, the EUV mask 200 is illustrated in a simplified manner.

According to an example embodiment, the reflecting layer 210 may reflect incident light. According to an example embodiment, the reflecting layer 210 may include a multilayer structure in which, for example, Mo/Si layers are alternately and repeatedly stacked in several tens of layers. In some embodiments, a substrate including, for example, glass, or quartz may be arranged under the reflecting layer 210.

The capping layer 220 may protect the reflecting layer 210. According to an example embodiment, the capping layer 220 may be formed of, for example, ruthenium oxide (RuO). In other example embodiments, the material of the capping layer 220 may be different or the capping layer 220 may be omitted.

The absorbing layer 230 may be a layer that absorbs light. According to an example embodiment, the absorbing layer 230 may include, for example, metal or inorganic material that is opaque to light. According to an example embodiment, the absorbing layer 230 may include a tantalum (Ta)-based compound such as TaN, TaBN, or TaBON. According to another example embodiment, the absorbing layer 230 may include other metal materials such as Al, Cr, and W. A portion of the reflecting layer 210 exposed through the absorbing layer 230 may reflect incident light.

The ARC layer 240 may prevent the reflection of light incident thereon. According to an example embodiment, the ARC layer 240 may include, for example, silicon nitride (SiN), silicon oxide (SiO), silicon oxynitride (SiON), molybdenum silicon nitride (MoSiN), molybdenum silicon oxide (MoSiO), molybdenum silicon oxynitride (MoSiON), or titanium nitride (TiN). According to an example embodiment, the ARC layer 240 may include an amorphous carbon film, an organic ARC, an inorganic ARC, or the like.

In the EUV exposure process, light may be incident on the EUV mask 200 at a predetermined incidence angle θ with respect to a normal line Ln, where the normal line Ln may be a third direction perpendicular to the first direction X and the second direction Y. According to an example embodiment, the incidence angle θ may be about 6°, for example. For the light incident at the incidence angle θ with respect to the normal line Ln, an image may be shifted or displaced (S) by the thickness of a pattern, for example, the thickness of the reflecting layer 210 and the ARC layer 240, and thus a shadowing effect may occur.

Figure 5B:
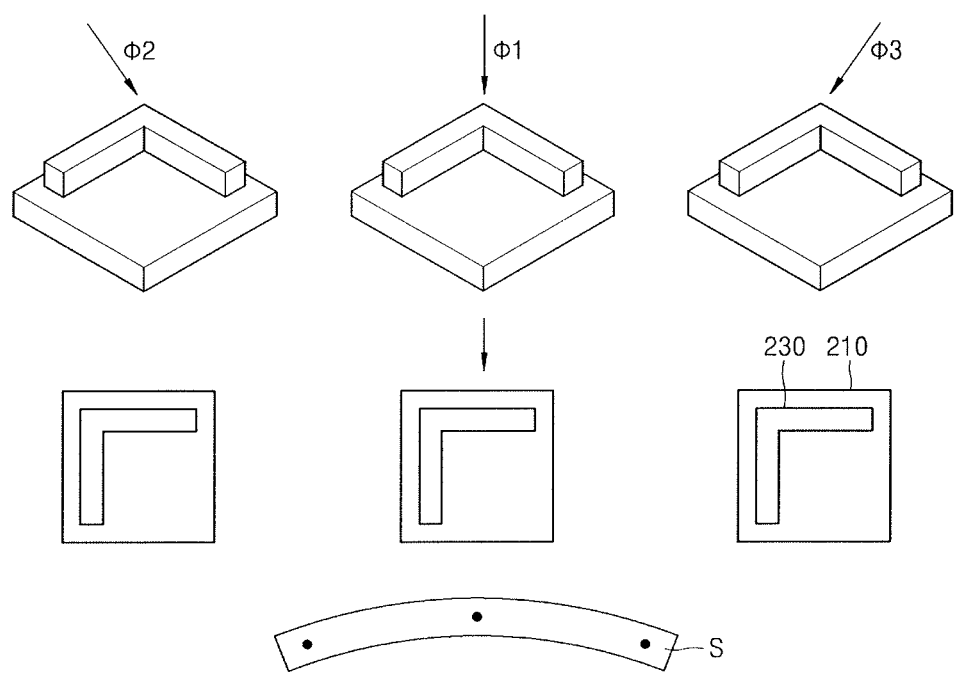
FIG. 5B illustrates a conceptual diagram of the light incidence to an EUV mask to describe the reason why aberration occurs in an EUV exposure process.

FIG. 5B is a conceptual diagram illustrating a slit and an EUV mask to describe aberration caused by the slit. In FIG. 5B, an upper portion illustrates a perspective view of the mask, and a lower portion illustrates a plan view of the mask and the slit.

Referring to FIG. 5B, in an EUV exposure process, a slit S may have a curved structure of an arc shape rather than a rectangular structure. A curved slit (S) structure in a reflective optical system may be an optimal structure for implementing a uniform illuminance distribution on a mask surface.

As the slit S has a curved structure, an azimuth angle Φ of the light passing through the slit S varies according to the portions of the slit S through which the light passes. For example, a first azimuth angle Φ1 at the center of the slit S may be 90°, the azimuth angle at the left end portion in the drawing may be a second azimuth angle Φ2 smaller than 90°, and the azimuth angle at the right end portion may be a third azimuth angle Φ3 greater than 90°. For example, the second azimuth angle Φ2 may be about 67°, and the third azimuth angle Φ3 may be about 113°. The azimuth angle of the light passing through the slit S may have a value of about 67° to about 113° depending on the portions of the slit S through which the light passes.

The difference in azimuth angle depending on the positions of the slit S may cause aberration in the light passing through the slit S. The aberration may be in aspects such as the intensity and phase of light, and may be the difference between a reference spherical surface centered on an image point and a wavefront after passing through an optical system. The aberration may be caused by the optical path difference between an ideal wavefront and a wavefront passing through the optical system. The aberration amount may be evaluated in units of wavelengths. When the maximum value of the aberration amount is not more than ¼ wavelength, the phase may be regarded as having no significant difference from the case where no aberration occurs, which may be referred to as a Rayleigh tolerance. The aberration exceeding the Rayleigh tolerance may cause distortion in the pattern formed by exposure.

For example, the edge portion of the slit S may have a large azimuth angle. Thus, the intensity of light incident on the reflecting layer 210 (see FIG. 5A) may be expected to be small. Thus, when light is irradiated to and reflected by the EUV mask 200 through the slit S, the critical dimension of a transferred pattern may be smaller than the critical dimension of an original designed pattern at a portion corresponding to the edge of the slit S. Similarly, when the critical dimension of a pattern corresponding to a dark portion is measured, the critical dimension of the transferred pattern may be greater than that of the original designed pattern.

By comparison, for a slit used in a deep ultraviolet (DUV) exposure process having a rectangular linear structure, there may be no change in the azimuth angle of the light passing through the slit and the aberration depending on the position of the slit may not be significant. Thus, the entire transferred structure may be monitored by monitoring a portion of the slit, for example, a center region thereof. On the other hand, in the case of an EUV exposure process using a curved slit having an arc structure, the effect of the EUV exposure process may vary according to the positions of the slit. In an example embodiment, the slit may be divided into sections and the pattern transferred by the EUV exposure process may be monitored with respect to each section. In the OPC performance, an error of an OPC method and/or a corresponding OPC model may be introduced if the effect of the position of the slit is not considered.

Figure 6:
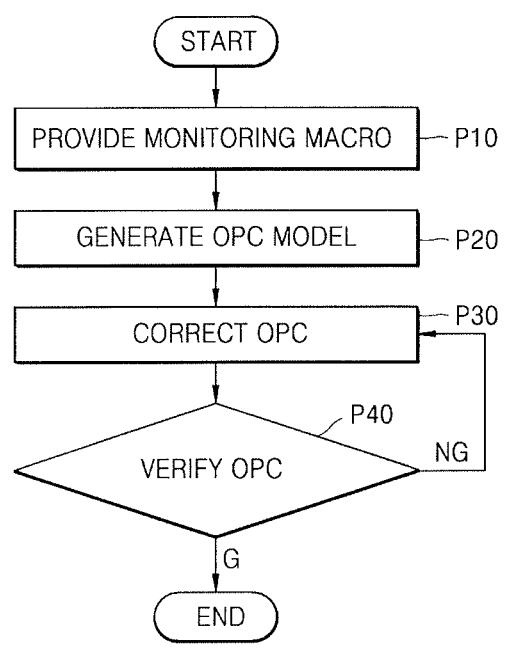
FIG. 6 illustrates a flowchart of an optical proximity correction (OPC) method according to an example embodiment.

FIG. 6 illustrates a flowchart of an OPC method according to an example embodiment.

Referring to FIG. 6, a monitoring macro may be provided in operation P10. The providing of the monitoring macro may be substantially the same as that described above with reference to FIGS. 1 to 3B. Thus, redundant descriptions thereof will be omitted for conciseness.

In operation P20, an OPC model including a monitoring macro may be generated. According to an example embodiment, OPC models may be generated based on a monitoring macro. According to an example embodiment, the generating of the OPC models based on the monitoring macro may include determining an OPC rule according to a measured critical dimension of the monitoring macro or a change in a simulated critical dimension.

According to an example embodiment, kernels representing a transfer process considering the optical proximity effect of a monitoring macro may be generated to perform a model-based OPC. According to an example embodiment, the difference between the shape of a monitoring macro and the shape of a monitoring macro transferred to a test substrate may be obtained by simulation through a process model including the kernels, and a mask pattern may be corrected according to the simulation result.

Hereinafter, a test substrate will be described with reference to FIGS. 7A to 7D. FIGS. 7A to 7D illustrate schematic layout diagrams of configurations of a test substrate.

A portion of a test substrate W corresponding to a reticle or one full shot is illustrated in FIGS. 7A to 7D.

Figure 7A:
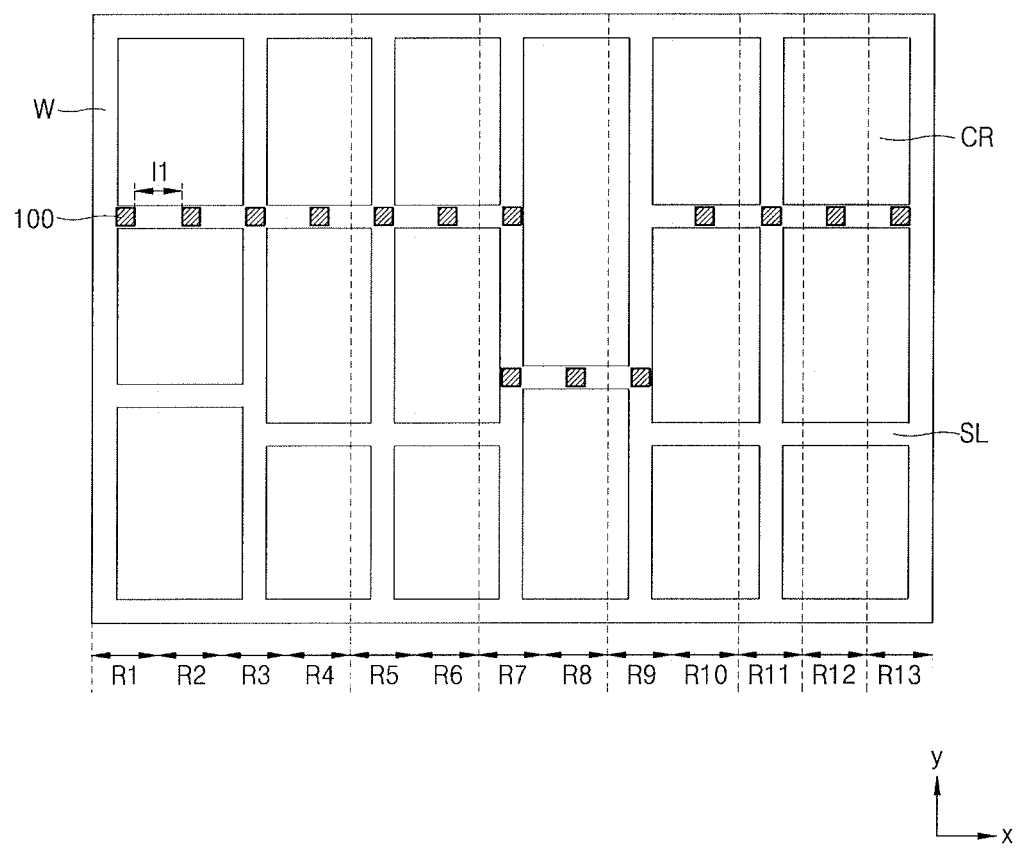
FIGS. 7A to 7D illustrate layout diagrams of OPC methods according to an example embodiment.

Referring to FIG. 7A, the test substrate W may include a circuit region CR and a scribe lane SL. The circuit region CR may be a region where various patterns and elements for forming a semiconductor device are formed. The scribe lane SL may be a space that is used to cut a semiconductor substrate and separate a plurality of semiconductor chips on the semiconductor substrate into individual chips or dies.

The directions parallel to the top surface of the test substrate W while intersecting each other will be referred to as a first direction X and a second direction Y. The first direction X and the second direction Y may be perpendicular to each other. The definitions of the directions may be the same in FIGS. 7B-7D.

Referring to FIG. 7A, the test substrate W may include a plurality of monitoring macros 100. The monitoring macros 100 may be substantially the same as those described above with reference to FIGS. 3A and 3B. Thus, redundant descriptions thereof will be omitted for conciseness.

According to an example embodiment, the monitoring macros 100 may be arranged on the scribe lane SL. According to an example embodiment, the distances between adjacent monitoring macros 100 in the first direction X may be substantially equal to each other as a first interval IL The first direction X may be a substantial extension direction of a slit. Aberration caused by the slit may occur in the first direction X. The second direction Y may correspond to a direction in which an EUV light source scans the test substrate W. According to an example embodiment, the monitoring macros 100 may be arranged at positions that equally divide a portion corresponding to one full shot of the test substrate W in the first direction X.

Figure 7B:
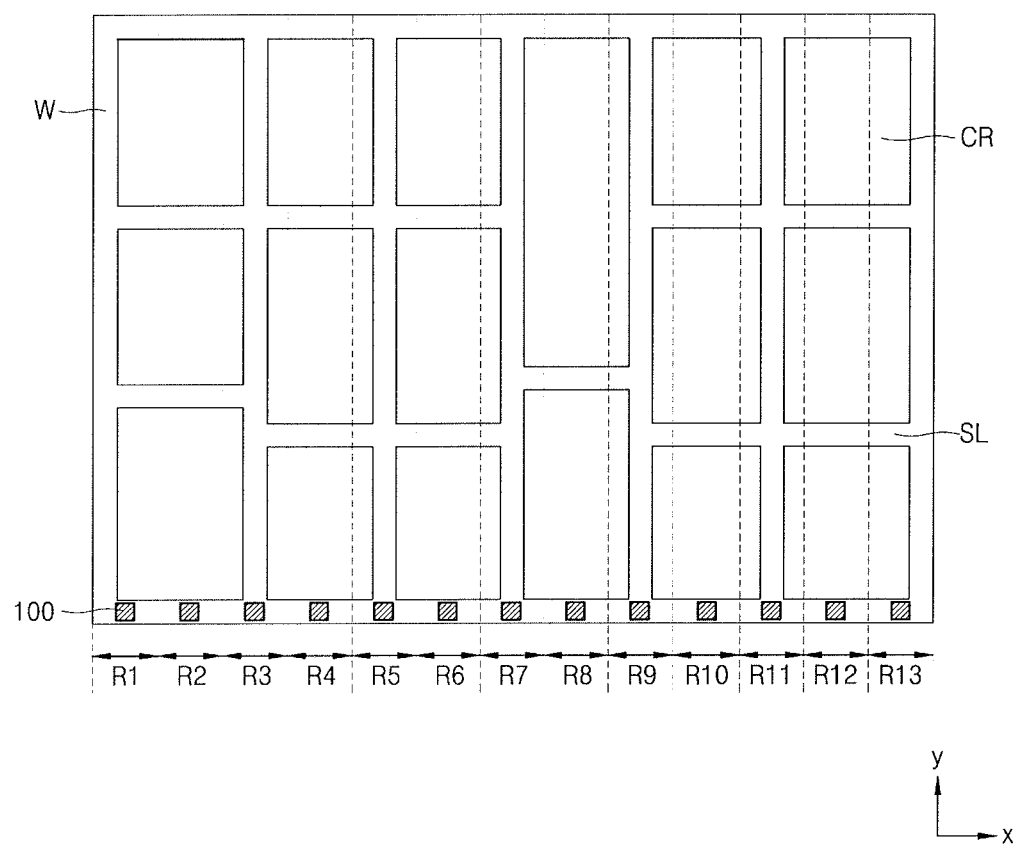

As shown in FIG. 7A, each monitoring macro 100 may be arranged in the scribe lane SL between the circuit regions CR. According to another example embodiment, as illustrated in FIG. 7B, the monitoring macro 100 may be arranged, for example, on the scribe lane SL outside the circuit region CR.

A portion of the test substrate W corresponding to one full shot or a reticle may be divided in the X direction into first to thirteenth regions R1, R2, ..., R13 each corresponding to at least one monitoring macro.

For example, according to an example embodiment, the first region R1 may be the leftmost region or correspond to the region located at the smallest distance in the first direction X from the left first monitoring macro 100 in the drawing. According to an example embodiment, the second region R2 may be the second from the left region or correspond to the region located at the smallest distance in the first direction X from the left second monitoring macro 100 in the drawing. Likewise, the third to thirteenth regions R3 ..., R13 may be divided, and for example, the thirteenth region R13 may correspond to the region located rightmost or at the smallest distance in the first direction X from the rightmost monitoring macro in the drawing. According to an example embodiment, the monitoring macro 100 may be arranged at a substantial center of the first to thirteenth regions R1, R2, ..., R13 in the first direction X.

According to an example embodiment, the first to thirteenth regions R1, R2, ..., R13 may substantially equally divide the test substrate W corresponding to one full shot or a reticle. According to an example embodiment, the areas of the first to thirteenth regions R1, R2, ..., R13 may be substantially equal to each other. The first direction X may be a direction in which the slit extends substantially, and the effect of aberration may vary in the first direction X. The slit may have a curved structure of an arc shape as described above, and the extension direction of the slit may be substantially parallel to the direction of a line segment connecting both ends of an arc formed by the slit.

According to an example embodiment, in order to determine an OPC rule for the first region R1, an OPC rule for the first region R1 may be determined based on the monitoring macro 100 included in the first region R1. According to an example embodiment, OPC rules for the second to thirteenth regions R2, ..., R13 may be determined based on the monitoring macros 100 included in the second to thirteen regions R2, ..., R13, respectively.

According to an example embodiment, the OPC rules for at least some of the first to thirteenth regions R1, R2, ..., R13 may be substantially identical to each other. According to an example embodiment, the OPC rules between some adjacent regions among the first to thirteenth regions R1, R2, ..., R13 may be substantially identical to each other. According to an example embodiment, the number of regions may be equal to or greater than the number of OPC rules that are distinguished from each other. The OPC rules between some adjacent regions may be substantially identical to each other. Thus, the OPC rules may not vary depending on the division of the region according to the arrangement of the monitoring macro 100. By way of example, in FIG. 7A, a portion of the test substrate W corresponding to one full shot or a reticle is divided into 13 regions. In other example embodiments, for example, 12 or fewer OPC rules may be provided. In other example embodiments, different OPC rules may be provided for the respective monitoring macros 100.

Figure 7C:
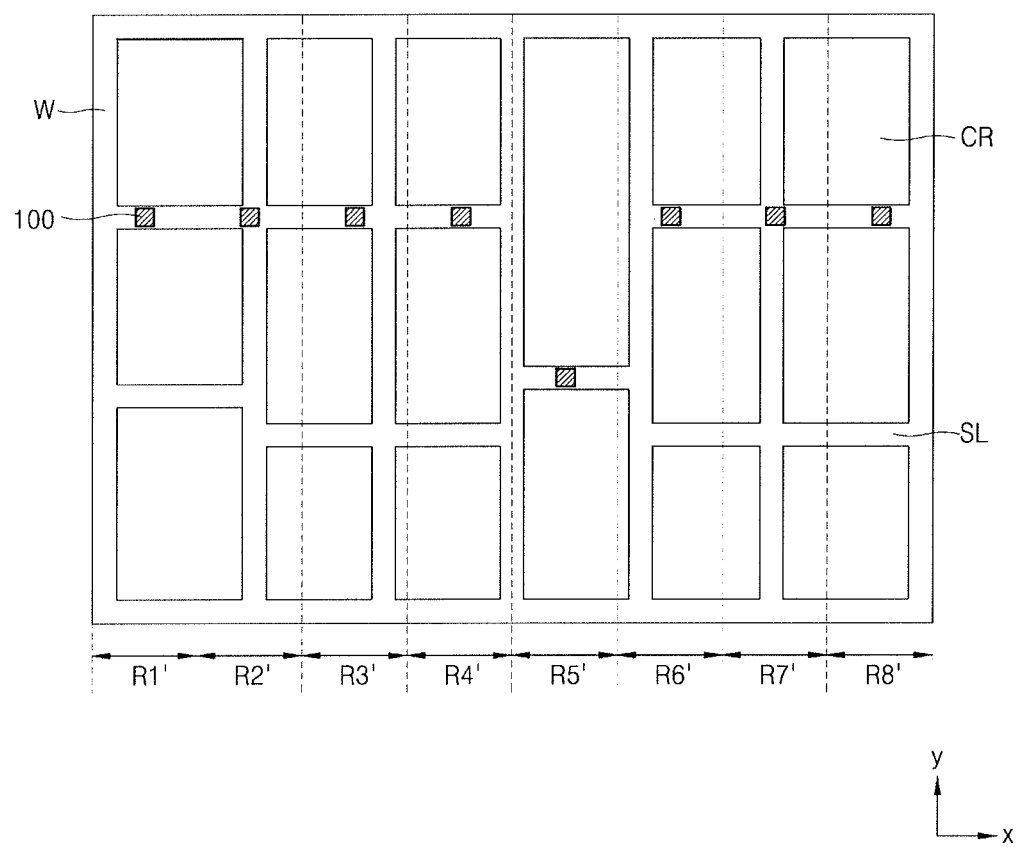

In the example embodiment illustrated in FIG. 7A, 13 monitoring macros are given and one full shot or reticle is divided into 13 regions. In other example embodiments, more or fewer than 13 monitoring macros may be given, and a portion of the test substrate W corresponding to the reticle or full shot may be divided according to the number of monitoring macros. Also, an even number of monitoring macros may be given such that the test substrate W corresponding to the reticle or full shot may be divided into an even number of regions. For example, as illustrated in FIG. 7C, eight monitoring macros may be given such that the test substrate W may be divided into eight first to eighth regions R1', R2', ..., R8'.

Figure 7D:
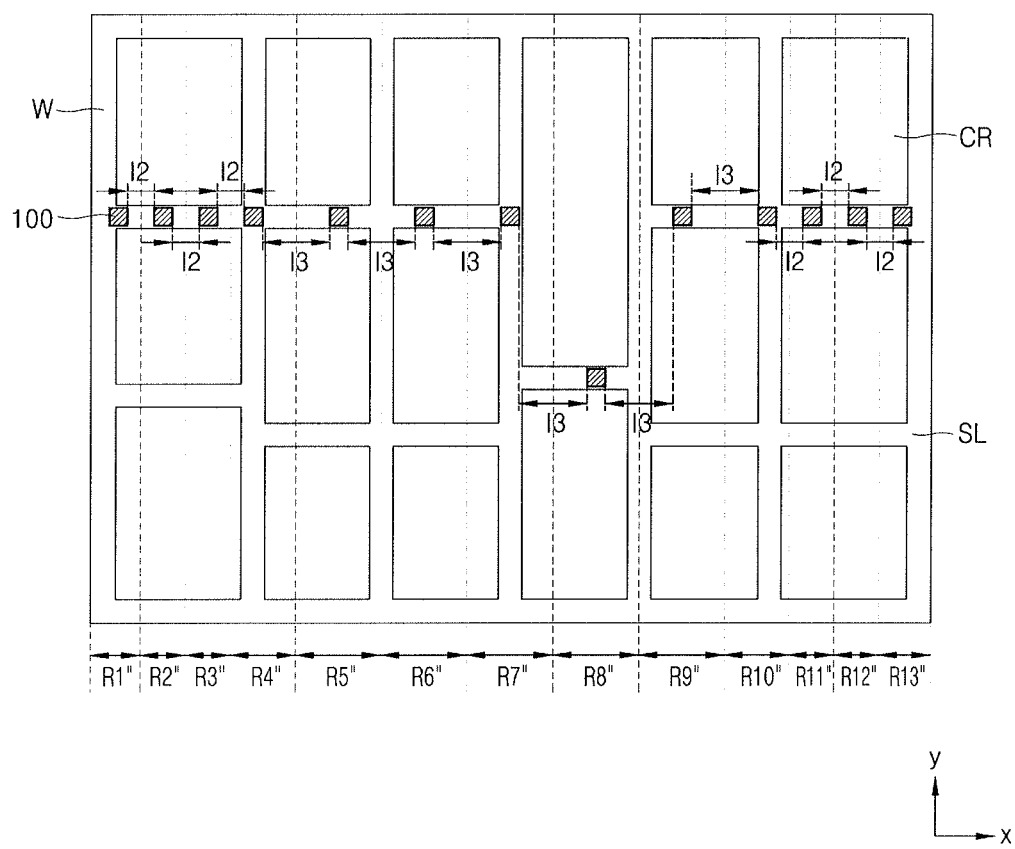

Referring to FIG. 7D, the intervals between monitoring macros 100 according to an example embodiment may not be uniform. According to an example embodiment, the interval between the monitoring macros 100 adjacent to the edge may be a second interval I2 that is smaller than the first interval I1 of FIG. 7A. According to an example embodiment, the interval between the monitoring macros 100 may be a second interval I2 that is smaller than the first interval I1 of FIG. 7A. According to an example embodiment, the interval between the monitoring macros 100 adjacent to the center portion may be a third interval I3 that is greater than the first interval I1 of FIG. 7A. In other example embodiments, the interval between the monitoring macros 100 in the center portion may be smaller than the interval between the monitoring macros 100 in the edge portion. The first to thirteenth regions R1", R2", ..., R13" of FIG. 7D may be divided in substantially the same manner as in FIG. 7A.

According to an example embodiment, the areas of the divided regions may be different from each other. According to an example embodiment, some of the divided regions may have a smaller area than the other regions. According to an example embodiment, the areas of the first to third regions R1", R2", and R3" and the eleventh to thirteenth regions R11", R12", and R13" may be smaller than the areas of the fourth to tenth regions R4", ..., R10". The areas of the fourth and tenth regions R4" and R10" may be smaller than the areas of the fifth to ninth regions R5", ..., R9". According to an example embodiment, the areas of the first to third regions R1", R2", and R3" and the eleventh to thirteenth regions R11", R12", and R13" may be substantially equal to each other. The areas of the fourth and tenth regions R4" and R10" may be substantially equal to each other. The areas of the fifth to ninth regions R5", ..., R9" may be substantially equal to each other. According to an example embodiment, the boundary between the regions may be substantially centered between two adjacent monitoring macros 100 in the first direction X. For example, the boundary between the first and second regions R1" and R2" on the left side in the drawing may be centered between the first and second monitoring macros 100 in the first direction X.

FIGS. 7A to 7D illustrate the test substrate W to which the monitoring macro 100 has been transferred. In other example embodiments, the arrangement of the monitoring macro may be applied in substantially the same manner to, for example, the design of a test substrate, a semiconductor substrate where a semiconductor device is to be formed, and the design thereof. According to an example embodiment, the monitoring macro 100 may be transferred onto a semiconductor substrate where an actual exposure process is performed in the manner described with reference to FIGS. 7A to 7D or in other manners. Thus, by examining a change in the critical dimension of a monitoring macro when testing a semiconductor substrate before individualization, a change in the pattern due to aberration may be monitored easily and quickly.

Referring again to FIG. 6, the OPC may be modified in operation P30. After an OPC model is generated based on a monitoring macro, a mask pattern may be obtained by simulation based on the OPC model, the acquired mask pattern may be compared with a target mask pattern to determine whether the acquired mask pattern matches the target mask pattern, and when there is a difference therebetween, the OPC may be corrected to match the target mask pattern. The correcting of the OPC may include adjusting OPC parameters such as OPC recipe adjustment, model calibration, and horizontal and vertical bias adjustment to transfer a desired pattern.

Subsequently, in operation P40, an OPC verification model may be generated to perform an OPC verification. According to an example embodiment, the OPC verification model may be the result of correcting an OPC model. The OPC verification may be a process of performing a simulation based on the OPC verification model and testing whether the mask pattern obtained by the simulation matches the target mask pattern. According to an example embodiment, the OPC verification may include testing, based on the simulation contour of a pattern, whether the OPC correction has been properly performed. According to an example embodiment, the OPC verification may be performed by a test on the monitoring macro 100 (see FIG. 3A).

According to an example embodiment, when the simulation contour based on the OPC verification model is within an error tolerance (G), the OPC method may be ended and a subsequent process may be performed. According to an example embodiment, when the simulation contour based on the OPC verification is out of the error tolerance (NG), the OPC model may be corrected in operation P20 by correcting parameters such as model calibration, OPC recipe, and bias, the OPC may be corrected in operation P30, and the OPC verification may be again performed in operation P40 by generating an OPC verification model.

The OPC method according to an example embodiment may easily perform the OPC at a high speed by performing the OPC using the monitoring macro. The aberration caused by the slit may be considered. Thus, the OPC with improved reliability and accuracy may be performed. Also, by performing the OPC verification using the monitoring macro, the OPC method according to an example embodiment may perform the OPC verification at a high speed, and/or may perform the OPC verification with improved reliability and accuracy.

Figure 8:
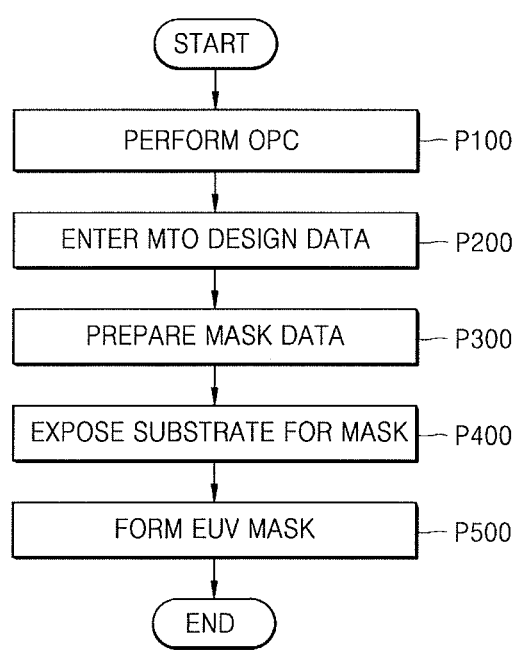
FIGS. 8 and 9 illustrate flowcharts of EUV mask manufacturing methods according to an example embodiment.
Figure 9:
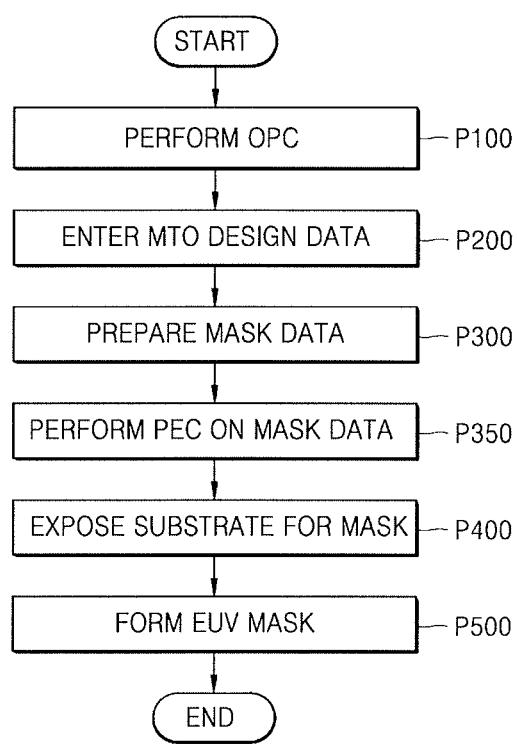

FIGS. 8 and 9 illustrate flowcharts of EUV mask manufacturing methods according to some example embodiments. For convenience of description, redundant descriptions already given with reference to FIGS. 1 and 6 will be omitted and differences therebetween will be mainly described.

Referring to FIG. 8, an OPC may be performed in operation P100. As described above with reference to FIGS. 1 and 6, the performing of the OPC may include a series of processes such as providing a monitoring macro, generating an OPC model based on the monitoring macro, correcting an OPC based on the OPC model, and verifying the OPC by generating an OPC verification model based on the monitoring macro.

Thereafter, mask tape-out (MTO) design data may be input in operation P200. The MTO may mean that the mask design data after completion of the OPC may be submitted to request mask fabrication. According to an example embodiment, the MTO design data may have a graphic data format used in electronic design automation (EDA) software or the like. According to an example embodiment, the MTO design data may have a data format such as Graphical Data System II (GDS2) or Open Artwork System Interchange Standard (OASIS).

Thereafter, a mask data preparation may be performed in operation P300. According to an example embodiment, the mask data preparation may include, for example, format conversion referred to as fracturing, a barcode for mechanical reading, a standard mask pattern for testing, augmentation of a job-deck, and automatic or manual verification. According to an example embodiment, the job-deck may mean generating a text file of a series of commands such as arrangement information of multiple mask files, a reference dose, and an exposure rate or mode. The dose may mean the dose of electron beams.

According to an example embodiment, format conversion, for example, fracturing, may mean a process of dividing the MTO design data into regions and changing to a format for an electron beam exposure device. According to an example embodiment, the division may be a process that may improve the quality of a final mask and may be performed proactively for mask process correction. The division may include, for example, data manipulation such as scaling, data sizing, data rotation, pattern reflection, and color inversion.

According to an example embodiment, data about systematic errors that may occur during the transfer from design data to an image on a semiconductor substrate may be corrected in a conversion process based on the division. The systematic errors may be caused, for example, by the distortions occurring in an exposure process, a mask development process, an etching process, and a semiconductor substrate imaging process.

According to an example embodiment, the mask data preparation may include a mask process correction (MPC), that is, a data correction process for the systematic errors. According to an example embodiment, the MPC may include operations such as critical dimension adjustment and/or pattern arrangement accuracy improvement.

Subsequently, in operation P400, a mask substrate may be exposed based on the mask data. According to an example embodiment, the exposure may be performed, for example, by electron beam writing. According to an example embodiment, for example, the electron beam writing may proceed in a gray scale or gray writing manner based on a multi-beam mask writer (MBMW). According to an example embodiment, the electron beam writing may be performed using, for example, a variable shape beam (VSB) exposure device.

According to an example embodiment, data processing may be performed before the exposure process. According to an example embodiment, the data processing may be a preprocessing process for the mask data and may include grammar check for the mask data, exposure time prediction, or the like. According to an example embodiment, after the mask data preparation, a process of converting the mask data into pixel data may be performed before the exposure process. The pixel data may be data directly used for actual exposure, and may include data about the shape to be exposed and data about the dose allocated to each shape. According to an example embodiment, the data about the shape to be exposed may be bit-map data into which shape data of vector data is converted through rasterization or the like.

Thereafter, in operation P500, subsequent processes may be performed to form an EUV mask. According to an example embodiment, the subsequent processes may include processes such as development, etching, and cleaning. According to an example embodiment, the subsequent process for forming an EUV mask may include a measurement process, a defect test process, or a defect repair process. According to an example embodiment, the subsequent process for forming a mask may include a pellicle application process. The pellicle application process may mean a process of confirming, through the final cleaning and test, that the surface of the EUV mask is free of contamination particles or chemical stains, and then attaching a pellicle to protect the surface of the mask from contamination or impact during the delivery of the mask and the available life period of the mask.

Referring to FIG. 9, an EUV mask manufacturing method according to an example embodiment may be similar to that described with reference to FIG. 8, and may further include, between operation P300 and operation P400, an operation P350 of performing a proximity effect correction (PEC) on the mask data. This PEC may be a process of correcting an electron beam proximity effect, which is an error caused by electron beam scattering.

The electron beam proximity effect may refer to a phenomenon in which a high acceleration voltage (used to generate an electron beam supplies high kinetic energy to electrons) scatters a resist and atoms of the material located thereunder. The electron beam proximity effect may be modeled by, for example, the overlap of two Gaussian functions or empirically-determined proximity functions. The electron beam proximity effect may be corrected based on the above modeling functions.

According to an example embodiment, the compensation of the electron beam proximity effect may include changing the dose at the time of actual exposure. According to an example embodiment, the electron beam proximity effect may be compensated by allocating a relatively low dose to a region having a high pattern density. According to an example embodiment, the electron beam proximity effect may be compensated by allocating a relatively high dose to shapes that are relatively small or isolated. According to an example embodiment, the proximity effect correction may include a method of correcting the edge of a pattern shape or changing the size of the pattern shape.

Figure 10:
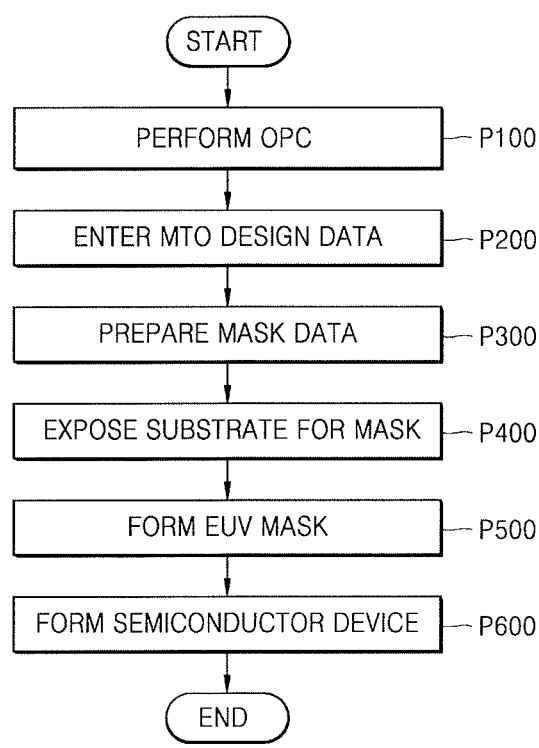
FIG. 10 illustrates a flowchart of a semiconductor device manufacturing method according to an example embodiment.

FIG. 10 is a flowchart illustrating a semiconductor device manufacturing method according to an example embodiment. For convenience of description, descriptions already given with reference to FIG. 8 will be not be repeated, and differences therebetween will be mainly described.

Referring to FIG. 10, an EUV mask may be manufactured by performing an EUV mask forming operation through a series of operations similar to those described with reference to FIG. 8. The semiconductor device manufacturing method of the present example embodiment may be similar to the EUV mask manufacturing method of FIG. 8, but a mask manufacturing method including, for example, the PEC operation of FIG. 9 may also be used.

Subsequently, in operation P600, a semiconductor device may be formed by performing various semiconductor processes on a semiconductor substrate using the manufactured EUV mask. According to an example embodiment, the process using the EUV mask may include a patterning process through an EUV exposure process. According to an example embodiment, through the patterning process using the EUV mask, a desired pattern may be formed on a semiconductor substrate or a material layer.

According to an example embodiment, the semiconductor processes may include, for example, a deposition process, an etching process, an ion process, and a cleaning process. According to an example embodiment, the deposition process may include a process for forming a material layer, such as chemical vapor deposition, atomic layer deposition, sputtering, or spin coating. According to an example embodiment, the ion process may include processes such as ion implantation, diffusion, and heat treatment. According to an example embodiment, the semiconductor process may include a packaging process in which the semiconductor device is mounted on a printed circuit board (PCB) and then sealed with a sealant. According to an example embodiment, the semiconductor process may include a test process for testing the semiconductor device or package.

By way of summation and review, EUV rays used in EUV lithography are highly absorbed by many materials. Thus, an optical system based on a reflector may be constructed and a reflective mask may be used in EUV lithography. As patterns are miniaturized, an optical proximity effect (OPE) may occur due to the influence between the patterns during an adjacent exposure process. Thus, an optical proximity correction (OPC) method may be used in a mask manufacturing process.

As described above, embodiments relate to EUV mask manufacturing methods, method of providing a monitoring macros, optical proximity correction (OPC) methods, and extreme ultraviolet (EUV) mask manufacturing methods, and more particularly, to method of providing monitoring macros and OPC methods. Embodiments may provide enhanced process monitoring in the manufacture of an EUV mask.

As described above, monitoring macros may be arranged at equal intervals in the extension direction of a slit where aberration occurs. For example, a monitoring macro may be selected by arranging, for example, 50 arrays of one standard cell and one lithography macro at, for example, 500-micron intervals to construct a full shot and then selecting, for example, 25 patterns that are most influenced by the aberration in the full shot. The monitoring macro may be used to perform optical proximity correction (OPC) rule generation, OPC correction, OPC verification, and the like.

Example embodiments may provide monitoring macros that may facilitate process monitoring. Example embodiments may provide optical proximity correction (OPC) methods and extreme ultraviolet (EUV) mask manufacturing methods that provide improved reliability.

Various operations of methods described above may be performed as is suitable, such as by various hardware and/or software components, modules, and/or circuits. When implemented in software, the operations may be implemented using, for example, an ordered listing of executable instructions for implementing logical functions, and may be embodied in a processor-readable medium for use by or in connection with an instruction execution system, apparatus, or device, such as a single or multiple-core processor or processor-containing system.

In some embodiments, blocks or steps of a method or algorithm and functions described in connection with the embodiments disclosed herein may be embodied directly in hardware, in a software module executed by a processor, or in a combination of software and hardware. If implemented in software, the functions may be stored on or transmitted over as one or more instructions or code on a tangible, non-transitory computer-readable medium. A software module may reside in, for example, Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other suitable form of storage medium.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming an extreme ultraviolet (EUV) mask, the method comprising:
constructing a first monitoring macro considering an aberration caused by a slit that restricts EUV light to a partial region of the EUV mask during an EUV exposure process of a semiconductor substrate;
performing an optical proximity correction (OPC), performing the OPC including generating an OPC model of an EUV mask design layout using a plurality of second monitoring macros, wherein each of the plurality of second monitoring macros is substantially identical to the first monitoring macro;
correcting the OPC model;
inputting mask tape-out (MTO) design data acquired through the corrected OPC model;
preparing mask data for the EUV mask, the mask data including at least one of data format conversion, mask process correction (MPC), and job-deck for the MTO design data; and
performing electron beam writing on a mask substrate, based on the mask data, the electron beam writing forming a mask pattern of the EUV mask in the mask substrate, the mask data including an electron beam dose that is used to form the mask pattern during the electron beam writing.

2. The method as claimed in claim 1, wherein, in the MTO design data, the plurality of second monitoring macros are arranged on a region corresponding to a scribe lane of the EUV mask.

3. The method as claimed in claim 2, wherein the plurality of second monitoring macros are spaced apart and arranged at equal intervals from each other in one direction.

4. The method as claimed in claim 3, wherein the one direction is a substantial extension direction of the slit used in the EUV exposure process.

5. A method of forming an extreme ultraviolet (EUV) mask, the method comprising:
constructing a first monitoring macro considering aberration caused by a slit that restricts EUV light to a partial region of the EUV mask during an EUV exposure process of a semiconductor substrate;
generating an OPC model of an EUV mask design layout including a plurality of second monitoring macros, wherein each of the plurality of second monitoring macros is substantially identical to the first monitoring macro;
correcting the OPC model;
preparing mask data using the corrected OPC model; and
performing electron beam writing on a mask substrate, based on the mask data, the electron beam writing forming a mask pattern of the EUV mask in the mask substrate, the mask data including an electron beam dose that is used to form the mask pattern during the electron beam writing.

6. The method as claimed in claim 5, further comprising, after the correcting of the OPC model, generating an OPC verification model based on the plurality of second monitoring macros and performing an OPC verification based on the OPC verification model,
wherein the correcting of the OPC model is repeated until there is no error in the performing of the OPC verification.

7. The method as claimed in claim 5, wherein the plurality of second monitoring macros are arranged on a region corresponding to a scribe lane of the EUV mask design layout.

8. The method as claimed in claim 7, wherein the plurality of second monitoring macros are arranged at equal intervals in one direction on the EUV mask design layout.

9. The method as claimed in claim 8, wherein the one direction is parallel to a direction in which the slit extends substantially.

10. The method as claimed in claim 5, wherein the constructing of the first monitoring macro includes:
generating a first simulation model by performing a first simulation on a sample macro including a plurality of pattern arrays each including a plurality of patterns and arranged and spaced apart from each other;
generating a second simulation model by performing a second simulation different from the first simulation on the sample macro;
comparing the first and second simulation models with each other; and
constructing the first monitoring macro by selecting at least some of the plurality of patterns in descending order of a critical dimension difference between the first and second simulation models.

11. The method as claimed in claim 10, wherein the first simulation is a simulation considering an effect caused by the slit, and the second simulation is a simulation not considering the effect caused by the slit.

* * * * *